United States Patent
Blodgett et al.

[19]

[11] Patent Number: 6,160,996
[45] Date of Patent: Dec. 12, 2000

[54] METHOD FOR ADAPTIVELY CONTROLLING AMPLIFIER LINEARIZATION DEVICES

[75] Inventors: James Russell Blodgett, Derry, N.H.; Michael W. Goodwin, North Andover; Harold Allan Simpson, Andover, both of Mass.; Robert Brian Ward, Auburn, N.H.

[73] Assignee: Lucent Technologies Inc., Murray Hill, N.J.

[21] Appl. No.: 09/052,833

[22] Filed: Mar. 31, 1998

[51] Int. Cl.[7] .................................................. H04B 1/04
[52] U.S. Cl. .......................... 455/63; 455/67.3; 455/114; 455/115
[58] Field of Search .......................... 455/63, 67.1, 67.3, 455/114, 115, 126, 561, 69, 127, 226.1, 226.2; 330/149, 151; 375/295, 296, 297

[56] References Cited

U.S. PATENT DOCUMENTS

| | | | |
|---|---|---|---|
| 4,879,519 | 11/1989 | Myer | 330/149 |
| 5,023,565 | 6/1991 | Lieu | 330/151 |
| 5,524,285 | 6/1996 | Wray et al. | 455/115 |
| 5,877,653 | 3/1999 | Kim et al. | 330/149 |

FOREIGN PATENT DOCUMENTS

| | | |
|---|---|---|
| 0 367 458 A2 | 5/1990 | European Pat. Off. . |
| 0 438 875 A2 | 7/1991 | European Pat. Off. . |

*Primary Examiner*—Reinhard J. Eisenzopf
*Assistant Examiner*—Lester G Kincaid

[57] ABSTRACT

A method for linearizing amplifiers by measuring the intermodulation products at the output of the linearized amplifier using minimum additional hardware without the performance problems associated with pilot tones. In one embodiment, the amplifiers are adaptively linearized using performance monitoring radios. Specifically, the performance monitoring radios are used to measure the signal levels of the intermodulation products in unused communication channels. Such measurements are then used to adaptively linearize the amplifiers and reduce the levels of intermodulation products.

7 Claims, 2 Drawing Sheets

METHOD FOR ADAPTIVELY CONTROLLING AMPLIFIER LINEARIZATION DEVICES

FIELD OF THE INVENTION

The present invention relates generally to communication systems and, more particularly, to linearized amplification devices used in wireless communication systems.

BACKGROUND OF THE RELATED ART

Amplifiers used in multi-channel applications, such as cellular radio and Personal Communication System (PCS) transceivers, typically produce output signals having desired signals and undesirable intermodulation products created by the amplifiers. While the intermodulation products may be at a very low level relative to the desired signals, the level of intermodulation products may be high enough to impair transmission or exceed some acceptable threshold or standard. The level of the intermodulation product created by the amplifiers is determined, in part, by the characteristics of the amplifiers, which is dependent on a variety of parameters, such as temperature, supply voltage, signal level, age, etc.

To reduce the level of the intermodulation products (i.e., linearize), the amplifier can be incorporated into a circuit having a linearizer. Various linearizers may be employed to linearize the amplifiers. Such linearizers incorporate well-known linearization techniques, such as feedforward, feedback, pre-distortion and post-distortion. Linearizing an amplifier involves adjusting the linearizers to match or track the characteristics of the amplifier being linearized.

Adjusting the linearizers to match or track the characteristics of the amplifier is relatively straightforward under static conditions, e.g., constant temperature, supply voltage, signal level, etc., as is well known in the art. Under non-static conditions, however, adjusting the linearizer to match or track the characteristics of the amplifier is more complex. Each time a parameter affecting the characteristics of the amplifier changes, the linearizer would need to be adjusted to compensate.

There are two fundamentally different approaches to adjusting linearizers to compensate for non-static conditions: open-loop and closed-loop control or compensation. Open-loop control involves measuring changes in the parameters affecting the characteristics of the amplifier (e.g., temperature), and using the measured parameter changes to adjust the linearizer to match or track the characteristics of the amplifier. The effectiveness of open-loop control depends upon how well the amplifier can be characterized (with respect to the parameters which affect the characteristics of the amplifier) and the range over which parameters can vary. For cellular radio and PCS transmitters, the effectiveness of open-loop control is generally inadequate because amplifier characteristics change with channel loading (i.e., number of carriers) and time.

Closed-loop control involves measuring the effects of changes in the parameters affecting the characteristics of the amplifier, and using the measured effects to adaptively adjust the linearizer to match or track the characteristics of the amplifiers. For multi-channel applications (e.g., cellular radio and PCS transceivers), the signal levels of the intermodulation products are measured to indicate the effects of the parameter changes. The intermodulation products may be measured relatively easy using spectrum analyzers. However, spectrum analyzers are, in most cases, prohibitively expensive. Another manner of measuring the intermodulation products involves using less expensive hardware associated with linearizers, such as pilot tone generators and receivers.

Measuring the intermodulation products using the pilot tone generators and receivers involves injecting pilot tones (using the pilot tone generators) into various points of the circuit (comprising the linearizer and the amplifier) to effectively simulate the intermodulation products. The signal levels of the pilot tones are then measured at the output of the circuit using the pilot tone receivers. The signal levels of the pilot tones at the output will provide an indication of the levels of the intermodulation products, which can be used to adaptively adjust the linearizer to match or track the characteristics of the amplifier.

Although the pilot tone generators and receivers are relatively inexpensive compared to the spectrum analyzers, the pilot tone generators and receivers do involve extra cost to the circuit. In addition, the pilot tone generators and receivers have associated performance problems. First, it is not always obvious where to inject the pilot tones. The pilot tones should be injected where they will not interfere with the desired signals, and the pilot tones should be injected at points that will yield performance representative for the entire frequency band. Second, the pilot tones should be reduced to levels at the output (of the circuit) commensurate to those of the intermodulation products. This means that the levels of the pilot tones cannot be arbitrarily high, and may mean that the pilot tone receivers will have to be correspondingly more sophisticated to cancel the pilot tones at the output.

Accordingly, there exists a need for linearizing amplifiers by measuring the intermodulation products at the output of the linearized amplifier using minimum additional hardware without the performance problems associated with pilot tones.

SUMMARY OF THE INVENTION

The present invention is a method for linearizing amplifiers by measuring the intermodulation products at the output of the linearized amplifier using minimum additional hardware without the performance problems associated with pilot tones. In one embodiment, the amplifiers are adaptively linearized using performance monitoring radios. Specifically, the performance monitoring radios are used to measure the signal levels of the intermodulation products in unused communication channels. Such measurements are then used to adaptively linearize the amplifiers and reduce the levels of intermodulation products. Advantageously, this embodiment (1) provides a direct manner for measuring the intermodulation products since no other signals are being transmitted over the unused communication channels, and (2) involves no additional cost to wireless communication systems since performance monitoring radios are typically standard equipment in the wireless communication systems.

BRIEF DESCRIPTION OF THE DRAWINGS

The features, aspects, and advantages of the present invention will become better understood with regard to the following description, appended claims, and accompanying drawings where:

DETAILED DESCRIPTION

Figure 1:
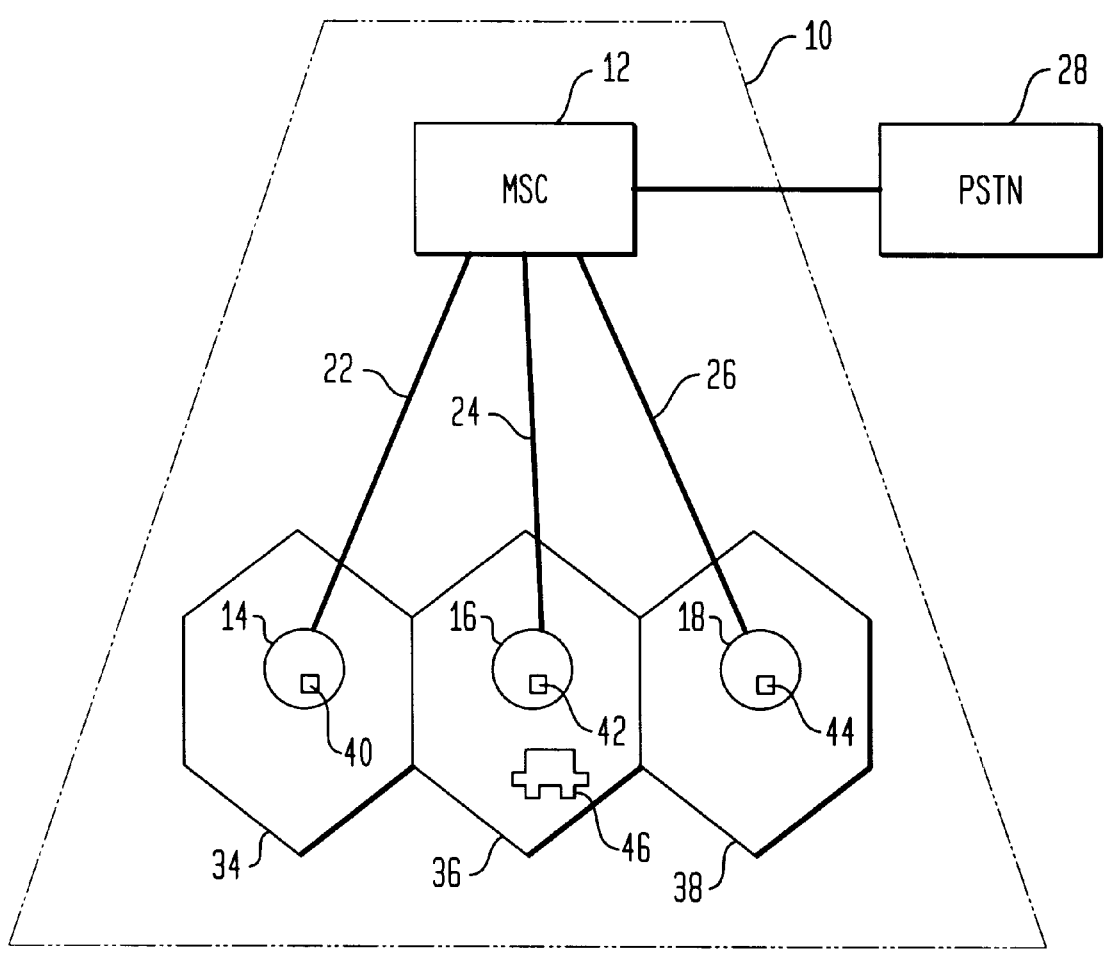
FIG. 1 depicts a wireless communication system used in accordance with the present invention.

FIG. 1 shows a wireless communication 10 used in accordance with the present invention. Wireless communication system 10 comprises a mobile switching center (MSC) 12 and base stations 14, 16, 18. Each of the base stations 14, 16, 18 are connected via T1 lines 22, 24, 26 to MSC 12, which is connected to a public switching telephone network (PSTN) 28. Base stations 14, 16, 18 provide wireless communication services to mobile-telephones 46 within geographic coverage areas referred to as cells 34, 36, 38. Associated with each of the base stations 14, 16, 18 are sets of communication channels for communicating voice and/or data messages to and from mobile-telephones within the geographic coverage areas, wherein the communication channels have associated frequencies. MSC 12 is operable to connect mobile-telephones to PSTN 28 via base stations 14, 16, 18, and to manage the resources of base stations 14, 16, 18 including assigning and unassigning the communication channels belonging to base stations 14, 16, 18. In order to assign and unassign communication channels, MSC 12 should have a priori knowledge or be operable to determine whether a communication channel is currently assigned to or used by one or more mobile-telephones. Alternately, base stations 14, 16, 18 should be operable to manage its own resources.

Each of the base stations 14, 16, 18 are equipped with cellular radio and/or Personal Communication System (PCS) transceivers 40, 42, 44 having performance monitoring radios, amplifiers and linearizers, all of which are well-known in the art. The performance monitoring radios being operable to receive and demodulate signals and to measure signal strength on a per communication channel basis; the amplifiers being operable to amplify the desired signals; and the linearizers being operable to linearize the amplifiers. The performance monitoring radios will have channel bandwidths corresponding to the standard in use, i.e., 30 kHz for IS-136 or 1.25 MHz for IS-95. The performance monitoring radios are utilized by the present invention to measure the signal level of the intermodulation products for purposes of tracking the characteristics and enhancing the linearization of the amplifiers, as will be described herein.

When signals are to be transmitted by one of the base stations 14, 16, 18, the signals are first amplified by the cellular radio/PCS transceivers 40, 42, 44. Amplification of the signals may create intermodulation products that will impair transmission or exceed some acceptable threshold or standard. Whether or not such intermodulation products are present depend on the frequencies of the signals. If these intermodulation products are present, the level of the intermodulation products are reduced using the linearizers and performance monitoring radios. Specifically, the present invention utilizes the performance monitoring radios to measure the levels of the intermodulation products falling on unused communication channels, and the linearizers to adaptively reduce the level of the measured intermodulation products.

The performance monitoring radios are used to measure the levels of the intermodulation products falling on unused communication channels (i.e., communication channels over which none of the amplified signals will be transmitted). Since the communication channels over which the signals are being transmitted are known, then the frequencies associated with such communication channels are also known. Based on these known frequencies, it is possible to calculate the frequencies at which the intermodulation products will fall or be created, as is well-known in the art. For example, for two signals: one at $F_1$ and the other at $F_2$, a third-order non-linearity will produce intermodulation products at $2F_1-F_2$ and $2F_2-F_1$. For three signals: one at $F_1$, one at $F_2$, and the other one at $F_3$, the intermodulation products will fall at $F_1+F_2-F_3$, $F_1+F_3-F_2$, etc. Therefore, given the knowledge of the frequencies of the signals and whether a communication channel is currently assigned or used, as mentioned earlier, it is possible to determine 1) the frequencies at which the intermodulation products will fall, and 2) whether those frequencies fall on unused communications channels where the level of the intermodulation products can be measured directly. Such information allows the performance monitoring radios to be tuned to unused communication channels where the intermodulation products are present and measure the corresponding signal levels. Adaptive means can then be used to adjust the linearizer to reduce the level of the intermodulation products falling on the unused communication channels.

Note that the intermodulation products falling on used communication channels are not being measured and used for adaptively adjusting the linearizer. The reason being because other signals are also present on those communication channels (e.g., voice and/or data traffic being transmitted between mobile-telephones and base stations). Thus, the signal levels of the intermodulation products falling on used communication channels cannot be measured directly by the performance monitoring radios. By contrast, the intermodulation products falling on the unused communication channels can be measured directly by the performance monitoring radios because only the intermodulation products should be present on those communication channels or frequencies.

Figure 2:
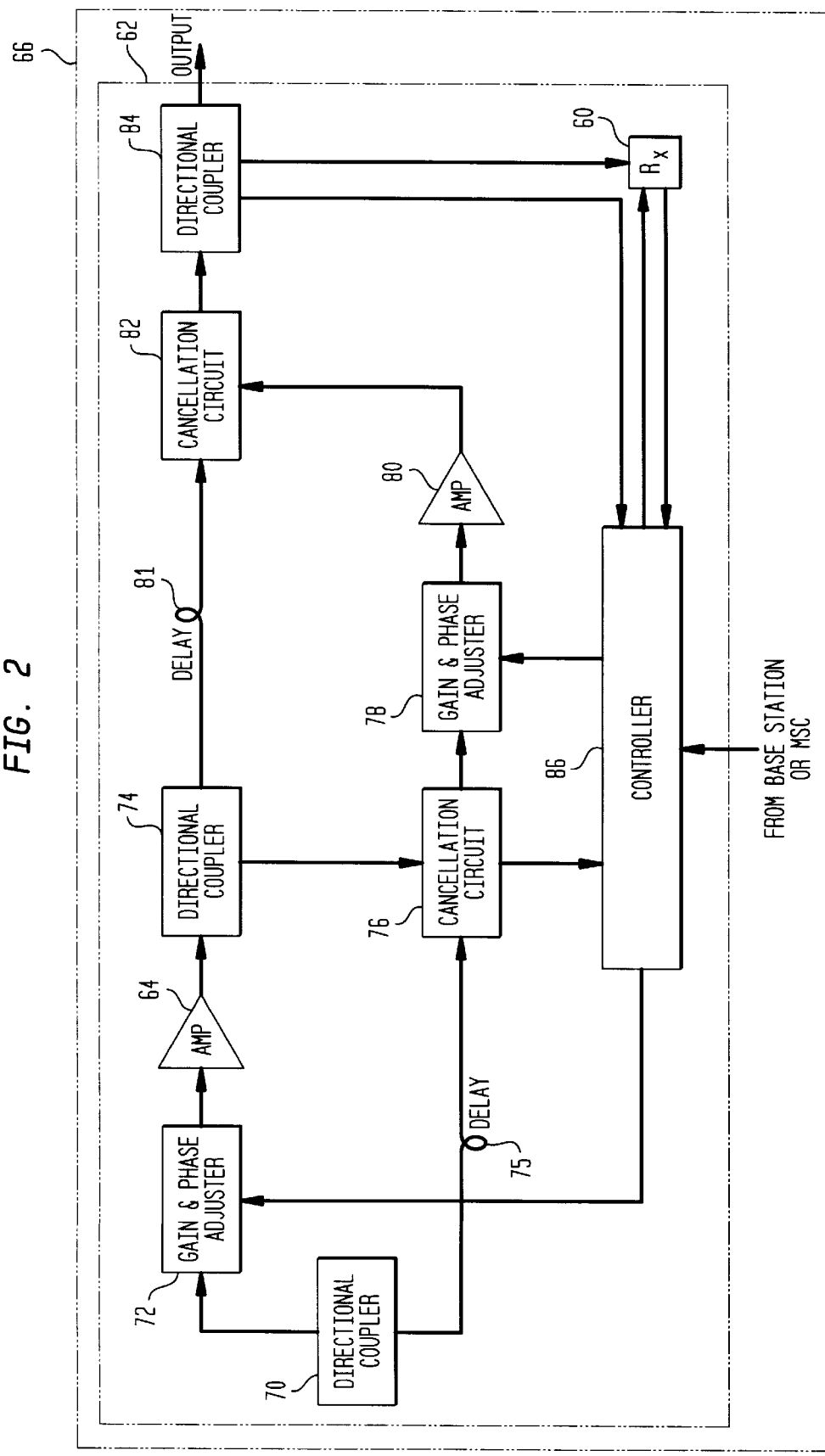
FIG. 2 depicts a schematic diagram of one possible cellular radio or PCS transceiver equipped with an amplifier linearization device.

FIG. 2 illustrates a schematic diagram of one possible cellular radio/PCS transceiver 60 having an amplifier linearization device 62 used in accordance with the present invention. As shown in FIG. 2, the amplifier linearization device 62 comprises an amplifier 64, a performance monitoring radio 66 and a linearizer, wherein the linearizer includes directional couplers 70, 74, 84, gain and phase adjusters 72, 78, delays 75, 81, cancellation circuits 76, 82, correction amplifier 80 and controller 86. In this example, controller 86 receives information (from a base station or a mobile-switching center) indicating which communication channels are used or unused. Based on this information and the frequencies of the signals, the controller 86 instructs the performance monitoring radio 66 on which unused communication channels to measure signal levels for the intermodulation products created by the signals.

The performance monitoring radio 66 will measure the signal levels of such intermodulation products in the unused communication channels and relay these measurements to the controller 86. The controller 86 will use the measurements from the performance monitoring radio 66 (and/or the output signal from the cancellation circuit 76) to adaptively control the gain and phase adjusters 72 and/or 78 to reduce the level of the intermodulation products in the output of the feed-forward amplifier 62. Specifically, the gain and phase adjusters 72 and/or 78 are adjusted to modify the amplitude and phase of signals entering them such that the signal level of the intermodulation products are reduced at the output of the amplifier linearization device 62.

Note that when certain types of linearizers are adjusted, gain is affected as well as linearity. This is undesirable since the goal is generally to reduce the levels of the intermodulation product levels without affecting the signal levels of the signals. If only the intermodulation product levels are measured, an adaptive system might result in the linearizer simply reducing the gain and hence output signal level of the system. For this reason, it is desirable to hold the output power of the system constant while adjusting the linearizer.

This can be done by measuring the signal level of a signal with the performance monitoring radio, and adjusting the output accordingly. Measurements of the signal power, intermodulation power, and their ratio will yield enough information to correctly adjust the linearizer.

If, for whatever reason, a performance monitoring radio is not available, a simple radio could be added to the linearized amplifier system to perform the function of a performance monitoring radio. This would of course add to the cost, but at least the difficulties associated with pilot tones would be avoided.

Although the present invention has been described in considerable detail with reference to certain embodiments, other versions are possible. Therefore, the spirit and scope of the present invention should not be limited to the description of the embodiments contained herein.

We claim:

1. A method for adaptively controlling an amplifier linearization device comprising the steps of:

determining frequencies for intermodulation products using frequencies of signals being transmitted;

measuring signal levels of said intermodulation products in unused communication channels; and adjusting the amplifier linearization device using the signal levels of said intermodulation products being measured.

2. The method of claim 1, wherein the step of measuring comprises the step of:

determining whether the frequencies of the intermodulation products are associated with communication channels not currently being used to transmit other signals.

3. The method of claim 1, wherein the signal levels of the intermodulation products are measured using performance monitoring radios.

4. The method of claim 3, wherein the step of measuring comprises the step of:

tuning the performance monitoring radios to the unused communication channels.

5. The method of claim 1 further comprising the additional step of:

receiving information indicating whether a communication channel is being used for transmitting signals.

6. The method of claim 1, wherein the step of adjusting the amplifier linearization device comprises the step of:

adjusting gain and phase adjusters using the signal levels of the intermodulation products being measured.

7. The method of claim 1, wherein the amplifier linearization device is adjusted until the signal levels of the intermodulation products are below a threshold level.

* * * * *